(12) United States Patent
Rizzardini et al.

(10) Patent No.: US 11,550,427 B2
(45) Date of Patent: Jan. 10, 2023

(54) SYSTEM FOR DETECTING A TOUCH GESTURE OF A USER, DEVICE COMPRISING THE SYSTEM, AND METHOD

(71) Applicant: STMICROELECTRONICS S.r.l., Agrate Brianza (IT)

(72) Inventors: Federico Rizzardini, Settimo Milanese (IT); Lorenzo Bracco, Chivasso (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/711,853

(22) Filed: Apr. 1, 2022

(65) Prior Publication Data
US 2022/0326806 A1    Oct. 13, 2022

(30) Foreign Application Priority Data
Apr. 9, 2021    (IT) .................. 102021000008897

(51) Int. Cl.
*G06F 3/041*    (2006.01)
*G06F 3/043*    (2006.01)
(Continued)

(52) U.S. Cl.
CPC ............ *G06F 3/0418* (2013.01); *G06F 3/017* (2013.01); *G06F 3/043* (2013.01); *G06F 3/04166* (2019.05); *G06F 3/044* (2013.01)

(58) Field of Classification Search
CPC .... G06F 3/017; G06F 3/04166; G06F 3/0418; G06F 3/043; G06F 3/044
See application file for complete search history.

(56) References Cited

U.S. PATENT DOCUMENTS 5,844,415 A * 12/1998 Gershenfeld ..... B60R 21/01532
340/870.37
9,742,475 B2 * 8/2017 Pellew ................. H04B 5/0075
(Continued)

FOREIGN PATENT DOCUMENTS

EP    2350782 A1    8/2011
EP    2980609 A1    2/2016
(Continued)

OTHER PUBLICATIONS

Kharaje et al., "Digital Pen for Paralyzed Patient," International Conference on Communication and Signal Proccessing, Apr. 6-8, 2016, India, pp. 1908-1911.

*Primary Examiner* — Michael Pervan
(74) *Attorney, Agent, or Firm* — Seed Intellectual Property Law Group LLP

(57) ABSTRACT

System for detecting a touch gesture of a user on a detection surface, comprising: a processing unit; and an accelerometer to detect a vibration at the detection surface and generate a vibration signal. The processing unit is configured to: acquire the vibration signal, detect, in the vibration signal, a signal characteristic which can be correlated to the touch gesture of the user, detect, in the vibration signal, a stationarity condition preceding and/or following the detected signal characteristic, and validate the touch gesture in the event that both the signal characteristic and the stationarity condition have been detected. An electrostatic charge sensor may also be used as a further parameter to validate the touch gesture.

20 Claims, 7 Drawing Sheets

(51) Int. Cl.
*G06F 3/01* (2006.01)
*G06F 3/044* (2006.01)

(56) References Cited

U.S. PATENT DOCUMENTS

| | | |
|---|---|---|
| 2009/0085865 A1 | 4/2009 | Fattah |
| 2010/0060604 A1 | 3/2010 | Zwart et al. |
| 2010/0177057 A1* | 7/2010 | Flint .................. G06F 3/04142 |
| | | 345/174 |
| 2010/0256947 A1 | 10/2010 | Kim et al. |
| 2013/0085700 A1* | 4/2013 | Modi ................... G01C 22/006 |
| | | 702/160 |
| 2013/0085711 A1* | 4/2013 | Modi ................... G01C 22/006 |
| | | 702/141 |
| 2014/0232516 A1 | 8/2014 | Stivoric et al. |
| 2015/0160780 A1* | 6/2015 | Park ...................... G06F 3/0488 |
| | | 345/173 |
| 2016/0342781 A1 | 11/2016 | Jeon |
| 2016/0359526 A1* | 12/2016 | Pellew ................. H04B 17/318 |
| 2017/0147125 A1* | 5/2017 | Yang ..................... G06F 3/0346 |
| 2021/0232227 A1 | 7/2021 | Passaniti et al. |

FOREIGN PATENT DOCUMENTS

| | | |
|---|---|---|
| EP | 3402074 A1 | 11/2018 |
| KR | 20110061750 A | 6/2011 |
| WO | WO 2010045498 A1 | 4/2010 |
| WO | WO 2020201341 A1 | 10/2020 |

\* cited by examiner

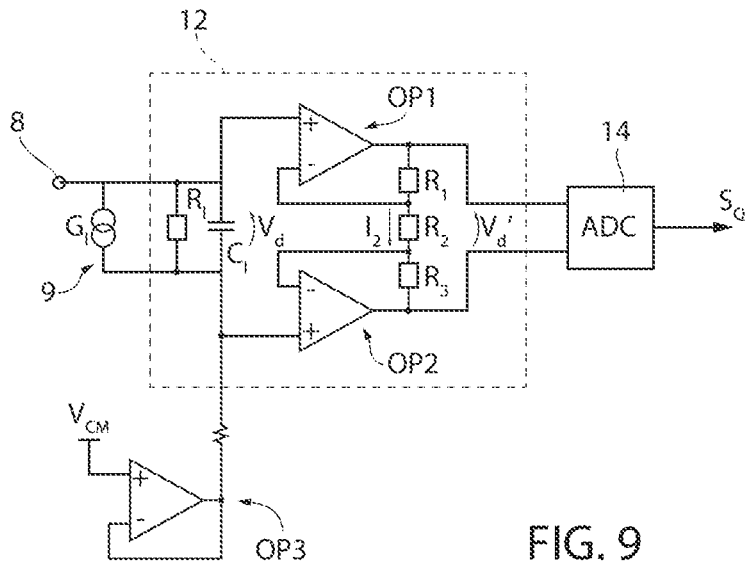
FIG. 9
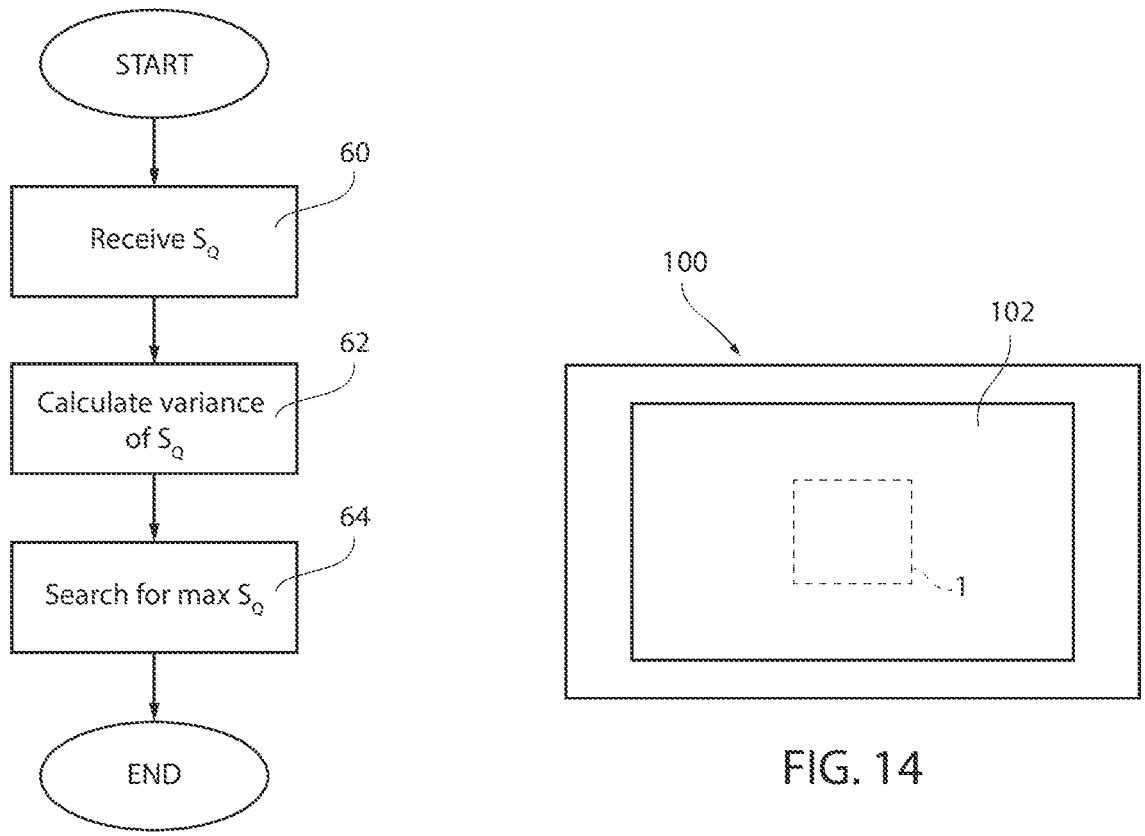
FIG. 10
FIG. 14

SYSTEM FOR DETECTING A TOUCH GESTURE OF A USER, DEVICE COMPRISING THE SYSTEM, AND METHOD

BACKGROUND

Technical Field

The present disclosure relates to a system for detecting a touch gesture of a user, a device comprising the detection system, and a method for detecting a touch gesture of a user.

Description of the Related Art

Nowadays, one of the most important causes of malfunction of mobile devices, in particular cell phones, relates to mechanical buttons, which are subject to breakage due to structural weakness, use of fragile flexible PCBs, problems of water resistance, etc.

The solutions to mechanical buttons provide buttons based on capacitive sensors, particularly suitable for implementation on full-screen devices; however they are not always reliable as they are subject to disturbances resulting from the presence of environmental electrical charge.

an embodiment

BRIEF SUMMARY

According to the present disclosure, a system for detecting a touch gesture of a user, a device comprising the detection system, and a method for detecting a touch gesture of a user are provided.

In an embodiment, the system for detecting a touch gesture of a user on a detection surface comprises:

a processing unit;

an accelerometer, operatively coupled to the processing unit, configured to detect a vibration at said detection surface and generate a corresponding vibration signal, wherein the processing unit is configured to: acquire the vibration signal, detect, in the vibration signal, a signal characteristic which can be correlated to said touch gesture of the user, detect, in the vibration signal, a stationarity condition preceding and/or following said detected signal characteristic, and validate said touch gesture by the user in the event that both the signal characteristic and the stationarity condition preceding and/or following said signal characteristic have been detected.

Furthermore, in an embodiment, the operation of detecting said signal characteristic comprises: calculating a filtered vibration signal by filtering, through a high-pass filter, the vibration signal; detecting a first peak of the filtered vibration signal exceeding a first threshold; and detecting a second peak of the filtered vibration signal exceeding a second threshold, wherein the first threshold is one of a positive threshold and a negative threshold, and the second threshold is the other of said positive threshold and said negative threshold.

Furthermore, in an embodiment, the processing unit is further configured to sample the vibration signal, and the operation of calculating the filtered vibration signal is carried out using a digital filter, said operation of detecting the first peak comprising: detecting a first sample of the filtered vibration signal which exceeds the first threshold; detecting a second sample of the filtered vibration signal immediately preceding the first sample and having a value, in modulus, which is lower than the value, in modulus, of the first sample; and detecting a third sample of the filtered vibration signal immediately following the first sample and having a value, in modulus, which is lower than the value, in modulus, of the first sample, said first peak corresponding to the first sample.

Furthermore, in an embodiment, said operation of detecting the second peak comprises: detecting a fourth sample of the filtered vibration signal which exceeds the second threshold; detecting a fifth sample of the filtered vibration signal immediately preceding the fourth sample and having a value, in modulus, which is lower than the value, in modulus, of the fourth sample; and detecting a sixth sample of the filtered vibration signal immediately following the fourth sample and having a value, in modulus, which is lower than the value, in modulus, of the fourth sample, said second peak corresponding to the fourth sample.

Furthermore, in an embodiment, the operation of detecting said signal characteristic further comprises verifying that the first peak and the second peak are at a mutual distance, in terms of number of samples comprised between the first peak and the second peak, which is lower than a maximum value of number of samples.

Furthermore, in an embodiment, the operation of detecting, in the vibration signal, a stationarity condition preceding said signal characteristic comprises: after detecting the first peak, verifying that the values of a first plurality of samples of the filtered vibration signal preceding the first peak are comprised in a first range of reference values.

Furthermore, in an embodiment, the operation of detecting, in the vibration signal, a stationarity condition following said signal characteristic comprises: after detecting the second peak, verifying that the values of a second plurality of samples of the filtered vibration signal following the second peak are comprised in a second range of reference values.

Furthermore, in an embodiment, the operation of detecting, in the vibration signal, a stationarity condition following said signal characteristic further comprises discarding a third plurality of samples of the filtered vibration signal immediately following the second peak and comprised between the second peak and said second plurality of samples of the filtered vibration signal.

Furthermore, in an embodiment, the system further comprises an electrostatic charge variation sensor, operatively coupled to the processing unit, configured to detect an electrostatic charge variation at said detection surface and, as a result, generate a charge variation signal.

Furthermore, in an embodiment, the processing unit is further configured to generate a variance signal by calculating the variance of the charge variation signal.

Furthermore, in an embodiment, the processing unit is further configured to detect a maximum point of the variance signal when said signal characteristic which can be correlated to said touch gesture of the user is detected in the vibration signal.

Furthermore, in an embodiment, the processing unit is further configured to: verify whether the maximum point of the variance signal is in a predefined relationship with a third threshold, and in the event that both the signal characteristic and the stationarity condition preceding and/or following said signal characteristic have been detected, validate said touch gesture only if the maximum point of the variance signal meets said predefined relationship with the third threshold.

Furthermore, in an embodiment, the processing unit is further configured to: in the event that both the signal characteristic and the stationarity condition preceding and/or following said signal characteristic have been detected, and if the maximum point of the variance signal meets said predefined relationship with the third threshold, verify whether the variance signal is in a stationarity condition and validate said touch gesture only if the variance signal meets said stationarity condition.

Furthermore, in an embodiment, the stationarity condition of the variance signal is met if at least one current sample of the variance signal has a value comprised within a range of stationarity reference values.

Furthermore, an embodiment provides the step of detecting a touch event that persists over time if the variance signal remains above a fourth threshold for a time which is longer than a predefined touch time.

The present disclosure also relates to a method for detecting a touch gesture of a user on a detection surface, using a system which comprises: a processing unit; and an accelerometer, operatively coupled to the processing unit, configured to detect a vibration at said detection surface and generate a corresponding vibration signal, the method comprising the steps, carried out by the processing unit, of: acquiring the vibration signal, detecting, in the vibration signal, a signal characteristic which can be correlated to said touch gesture of the user, detecting, in the vibration signal, a stationarity condition preceding and/or following said detected signal characteristic, and validating said touch gesture by the user in the event that both the signal characteristic and the stationarity condition preceding and/or following said signal characteristic have been detected.

Furthermore, in an embodiment, the step of detecting said signal characteristic comprises: calculating a filtered vibration signal by filtering, through a high-pass filter, the vibration signal; detecting a first peak of the filtered vibration signal exceeding a first threshold; and detecting a second peak of the filtered vibration signal exceeding a second threshold, wherein the first threshold is one of a positive threshold and a negative threshold, and the second threshold is the other of said positive threshold and said negative threshold.

Furthermore, in an embodiment, the method comprises the step of sampling the vibration signal, and wherein the step of calculating the filtered vibration signal is carried out using a digital filter, said step of detecting the first peak comprising: detecting a first sample of the filtered vibration signal that exceeds the first threshold; detecting a second sample of the filtered vibration signal immediately preceding the first sample and having a value, in modulus, which is lower than the value, in modulus, of the first sample; and detecting a third sample of the filtered vibration signal immediately following the first sample and having a value, in modulus, which is lower than the value, in modulus, of the first sample, said first peak being chosen corresponding to the first sample.

Furthermore, in an embodiment, the step of detecting the second peak comprises: detecting a fourth sample of the filtered vibration signal that exceeds the second threshold; detecting a fifth sample of the filtered vibration signal immediately preceding the fourth sample and having a value, in modulus, which is lower than the value, in modulus, of the fourth sample; and detecting a sixth sample of the filtered vibration signal immediately following the fourth sample and having a value, in modulus, which is lower than the value, in modulus, of the fourth sample, said second peak being chosen corresponding to the fourth sample.

Furthermore, in an embodiment, the step of detecting said signal characteristic further comprises verifying that the first peak and the second peak are at a mutual distance, in terms of number of samples comprised between the first peak and the second peak, which is lower than a maximum value of number of samples.

Furthermore, in an embodiment, the step of detecting, in the vibration signal, a stationarity condition preceding said signal characteristic comprises: after detecting the first peak, verifying that the values of a first plurality of samples of the filtered vibration signal preceding the first peak are comprised in a first range of reference values.

Furthermore, in an embodiment, the step of detecting, in the vibration signal, a stationarity condition following said signal characteristic comprises: after detecting the second peak, verifying that the values of a second plurality of samples of the filtered vibration signal following the second peak (p2) are comprised in a second range of reference values.

Furthermore, in an embodiment, the step of detecting, in the vibration signal, a stationarity condition following said signal characteristic further comprises discarding a third plurality of samples of the filtered vibration signal immediately following the second peak and comprised between the second peak and said second plurality of samples of the filtered vibration signal.

Furthermore, in an embodiment, wherein said system further comprises an electrostatic charge variation sensor, operatively coupled to the processing unit, the method further comprising the steps of detecting, through the electrostatic charge variation sensor, an electrostatic charge variation at said detection surface and generating as a result, through the electrostatic charge variation sensor, a charge variation signal.

Furthermore, in an embodiment, the method further comprises the step of generating a variance signal by calculating the variance of the charge variation signal.

Furthermore, in an embodiment, the method further comprises the step of detecting a maximum point of the variance signal when said signal characteristic which can be correlated to said touch gesture of the user is detected in the vibration signal.

Furthermore, in an embodiment, the method further comprises: verifying whether the maximum point of the signal of $(S_{Q\_var})$ is in a predefined relationship with a third threshold, and in the event that both the signal characteristic and the stationarity condition preceding and/or following said signal characteristic have been detected, validating said touch gesture only if the maximum point of the variance signal meets said predefined relationship with the third threshold.

Furthermore, in an embodiment, the method further comprises: in the event that both the signal characteristic and the stationarity condition preceding and/or following said signal characteristic have been detected, and if the maximum point of the variance signal meets said predefined relationship with the third threshold, verifying whether the variance signal is in a stationarity condition and validating said touch gesture only if the variance signal meets said stationarity condition.

Furthermore, in an embodiment, the stationarity condition of the variance signal is met if at least one current sample of the variance signal has a value comprised within a range of stationarity reference values.

Furthermore, in an embodiment, the method further comprises the step of detecting a touch event that persists over time if the variance signal remains above a fourth threshold for a time which is longer than a predefined touch time.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein:

FIG. 9 illustrates an embodiment of an electrostatic charge sensor, which can be used in the system of FIG. 8;

FIG. 10 illustrates a method for detecting a touch gesture exploiting a vibratory signal of an accelerometer and an electrostatic charge variation signal of the sensor of FIG. 9, according to an aspect of the present disclosure;

FIG. 14 illustrates an electronic device including the electronic or electromechanical system or chip or package of FIG. 3 or FIG. 8.

DETAILED DESCRIPTION

MEMS accelerometers are used to implement electronic buttons, as they are suitable for detecting movements resulted from the touch, or "tap," (or double tap) of the user, exploiting suitable algorithms that detect and process the acceleration data provided by these MEMS accelerometers. Even this solution, however, is subject to environmental or use conditions that may cause a false touch detection (for example due to accelerations resulting from movements of the user's body which are similar to a touch even if they are not such).

In some devices that do not suffer from battery consumption in stand-by (for example because they have a large battery), it is possible to use the touch-screen technology to detect the touch gesture. This type of solution ensures high accuracy, but the implementation cost is high and, as said, requires a non-negligible energy consumption.

In an embodiment known to the Applicant, the touch gesture is identified by processing and monitoring an acceleration signal or vibratory signal, provided by an accelerometer following a touch gesture, filtered through a high-pass filter. The high-pass filter is, in particular, configured to filter the low frequency signal components (e.g., acceleration due to gravity, movements attributable to human activity) and leave the high frequency signal components, including the signal components attributable to touch, unaltered. By way of non-limiting example, the high frequency components of interest for the present disclosure are higher than 50 Hz.

The filtering is, in particular, obtained through a digital "Slope" filter. Therefore, with reference to FIGS. 1A and 1i, the raw signal provided by the accelerometer (in FIG. 1A, the signal $S_{acc\_raw}$) is sampled (i.e., converted into digital); again in FIG. 1A, the n-th sample at time $t_n$ is identified as $acc(t_n)$ and the sample immediately preceding time $t_{n-1}$ is identified as $acc(t_{n-1})$.

Figure 1A:
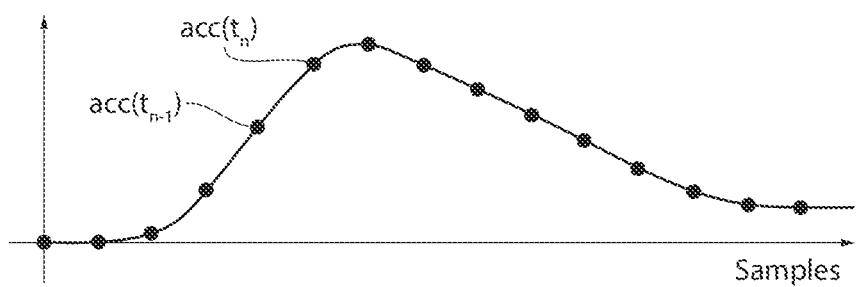
FIG. 1A illustrates a vibrational signal generated by an accelerometer following a movement.
Figure 1B:
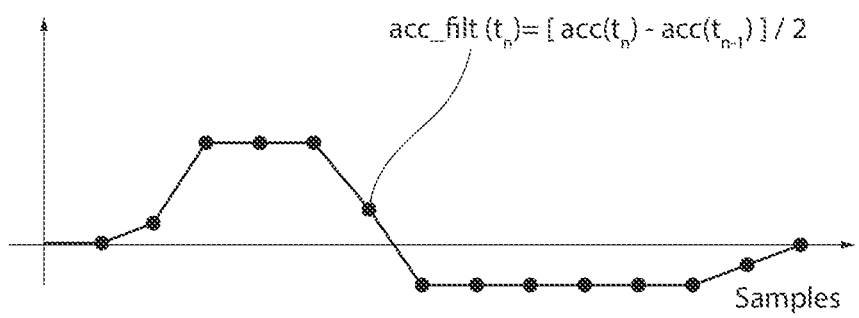
FIG. 1B illustrates the signal of FIG. 1a after a filtering step with a high-pass filter, according to the prior art.

FIG. 1B illustrates the signal of FIG. 1A filtered through the Slope filter (filtered signal $S_{acc\_filt}$). The n-th filtered sample is obtained according to the following formula:

$$acc\_filt(t_n) = [acc(t_n) - acc(t_{n-1})]/2$$

By setting a suitable threshold on the filtered signal, it is possible to identify possible touch events at the local exceedance of this threshold, by at least one sample of the filtered signal. The threshold may be of a fixed type (preset and/or configurable) or of adaptive type.

Figure 2:
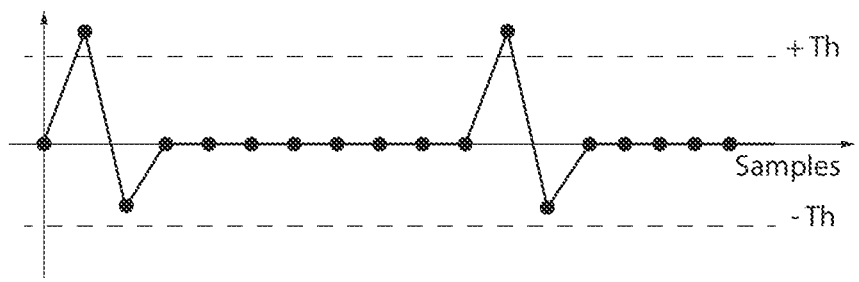
FIG. 2 illustrates a further signal generated by an accelerometer, filtered with the filter described with reference to FIG. 1B, wherein a touch event by a user is identified on the basis of the exceedance of predefined thresholds, according to the prior art.

FIG. 2 shows, by way of example, a further accelerometric signal, filtered with the Slope filter according to what has been described with reference to FIG. 1B. FIG. 2 also shows two thresholds (one positive +Th and one negative −Th). In FIG. 2, the exceedance of the threshold +Th occurs by two samples $acc\_filt(t_1)$ and $acc\_filt(t_{11})$ in two respective time instants $t_1$ and $t_{11}$ and causes the generation of an interrupt event that identifies the occurred touch at the times $t_2$ and $t_{12}$ since the signal returns within the range defined by the thresholds −Th and +Th by a predefined time.

This technical solution has the advantage of requiring low energy consumption and low cost; furthermore, it allows to obtain high accuracy in the identification of any touch event, but at the same time generates a significant number of false positives, for example in cases wherein the accelerometer detects vibrations resulting from an unwanted touch in proximity to the device (for example on the strap of a smartwatch, and in other similar situations).

The problems mentioned hereinabove are overcome by the solutions that provide the use of a touch sensor, which however, as said, has a high cost and significant energy consumption. Furthermore, the touch sensor technology is not applicable to any device (for example to earphones) due to the size and/or current consumption required for implementing a touch sensor.

The need is therefore felt to overcome the drawbacks of the prior art by providing a system for detecting a touch gesture of a user, a device comprising the detection system, and a method for detecting a touch gesture of a user which are enhanced.

Figure 3:
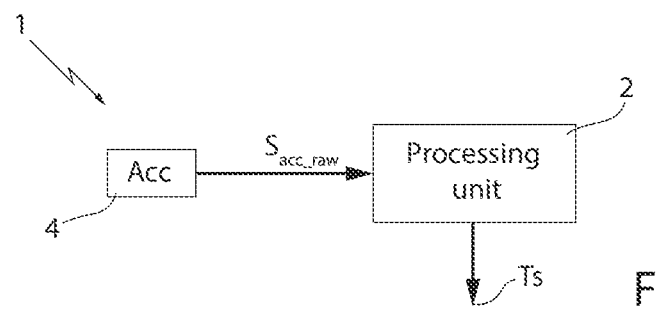
FIG. 3 schematically illustrates an electronic or electromechanical system or chip or package, according to an aspect of the present disclosure.

FIG. 3 illustrates, with the reference number 1, an electronic or electromechanical system or chip or package, according to an aspect of the present disclosure. Hereinafter, this system or chip or package 1 will be referred to as "electronic system" without thereby losing generality. The electronic system 1 comprises, e.g., integrates or accommodates in a case, a processing unit 2 and an MEMS motion sensor, e.g., an accelerometer 4, which is operatively coupled to the processing unit 2.

The accelerometer 4 is configured to detect at least one acceleration component along an acceleration axis orthogonal to a detection surface (see for example, in FIG. 14, the surface 102). The detection surface is a surface at which a user causes a vibration by touching this surface with, for example, his/her finger (touch event or touch). For example, the accelerometer 4 is of triaxial type, configured to detect acceleration components along three axes X, Y, Z orthogonal to each other; for detecting the touch, it is possible to choose the Z axis as the only detection axis, or otherwise choose any combination of two or more axes, possibly attributing a greater weight to one of them.

It is noted that the electronic system 1 (and therefore the accelerometer 4) may be installed or used with any orientation with respect to the Earth's gravitational axis, and therefore the accelerometer 4 may be oriented in such a way as not to have the vertical detection axis (Z axis) necessarily in the direction of the force of gravity. Therefore, the detection axis of the force impressed by the touch may be chosen orthogonal to the sensor itself or along the assumed direction of the touch (on the basis of the modes in which the electronic system 1 is installed or operates or is expected to operate); this also allows any unwanted impulses, which would come from other directions, to be filtered out.

As an alternative or addition to the above, it is also possible, in a further embodiment, to consider a suitable vector composition of the three detection axes of the accelerometer 4, to maximize the signal in the direction of the impressed force.

The processing unit 2 receives an acceleration signal, or vibration signal, $S_{acc\_raw}$ (raw signal) from the accelerometer 4 and generates, according to the acceleration signal $S_{acc\_raw}$, a touch detection signal Is (e.g., an interrupt signal) by a user.

The accelerometer 4 is for example an integrated sensor of semiconductor material, made using MEMS technology, of a per se known type and thereby not described in detail.

The processing unit 2 is for example a microcontroller or an MLC (Machine Learning Core) residing in the ASIC (Application Specific Integrated Circuit) integrated in the MEMS, or a microprocessor of other type.

The electronic system 1 may be a stand-alone system or be part, for example, of a printed circuit, or even be part of a more complex device or system. In fact, it is possible to provide a device or system that integrates a combo of sensors, and therefore in addition to the three axes X, Y, Z of the accelerometer 4, there may also exist dedicated channels for other detections (e.g., gyroscope, temperature sensor, etc.).

Figure 4:
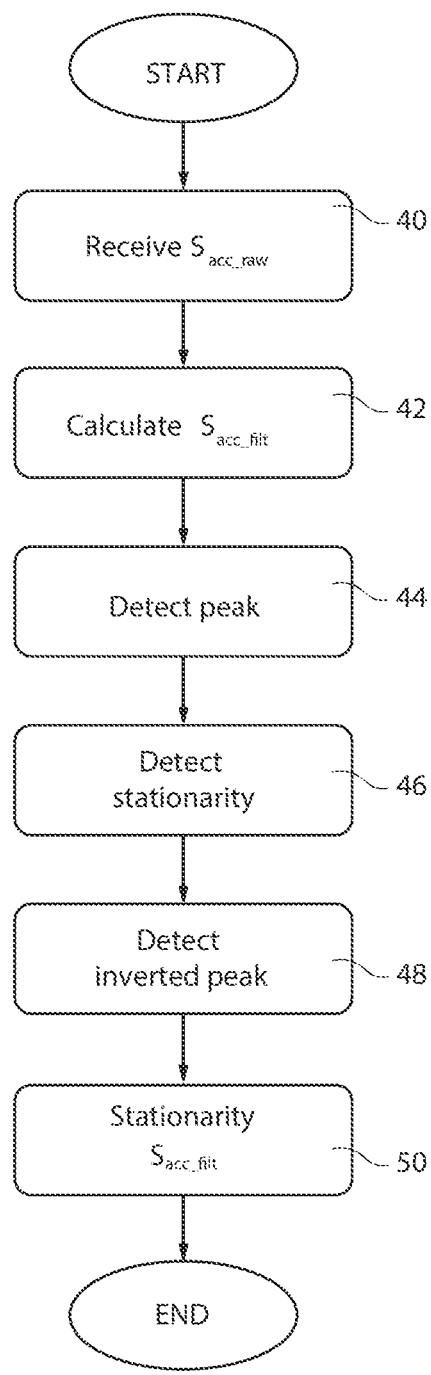
FIG. 4 illustrates a method for detecting a touch gesture exploiting a vibratory signal of an accelerometer, according to an aspect of the present disclosure.

FIG. 4 illustrates, through a flow chart, steps of a method for detecting the touch implemented by the electronic system 1, in particular by the processing unit 2, according to an aspect of the present disclosure.

With reference to step 40, the processing unit 2 receives and acquires, from the accelerometer 4, the raw signal $S_{acc\_raw}$ generated by the accelerometer 4, for example the signal $S_{acc\_raw}$ of FIG. 1A. Then, step 42, the processing unit 2 carries out an operation of filtering the raw signal $S_{acc\_raw}$ through a high-pass filter; in particular, the filtering operation is carried out through the Slope filter described with reference to FIG. 1B, obtaining the filtered signal $S_{acc\_filt}$. The filtered signal $S_{acc\_filt}$ is for example the signal of FIG. 1B, or FIG. 2, or FIG. 5 (or FIG. 6, or FIG. 7 wherein filtered signals resulting from events other than the touch event are illustrated).

Then, step 44, a detection of a first peak p1 (positive or negative) is carried out in the filtered signal and, subsequently, a detection of a second peak p2 which is an inverted peak (negative or positive, respectively) is carried out. In this regard see FIG. 5, wherein the peak p1 corresponds to a sample of the filtered signal $S_{acc\_filt}$ that exceeds the negative threshold −Th, and therefore is hereinafter referred to as the "negative peak", whereas the peak p2, following p1, corresponds to a sample of the filtered signal $S_{acc\_filt}$ that exceeds the positive threshold +Th, and therefore is hereinafter referred to as the "positive peak".

In an embodiment of the present disclosure, the negative peak p1 is identified as a sample that exceeds the threshold −Th and which is immediately preceded and followed by respective samples p1' and p1" which have a value, in modulus, which is lower than the value, in modulus, of the negative peak p1. Similarly, the positive peak p2 is identified as a sample that exceeds the threshold +Th and which is immediately preceded and followed by respective samples p2' and p2" which have a value, in modulus, which is lower than the value, in modulus, of the positive peak p2. It is noted that, in this example, the samples p1" and p2' coincide.

It is apparent that the conditions expressed hereinabove may be modified, for example by requiring a plurality of samples that precede and/or follow the positive p2 or negative peak p1 and having respective values which are lower in modulus than the value reached by the peak p1 or p2.

In an embodiment, the number of samples between the negative peak p1 and the positive peak p2 (in the example of FIG. 5, there is only one sample p1"/p2') is lower than a predefined maximum number, to better discriminate a "touch" event from an event of other type. For example, this number of samples is equal to 2 (sampling the raw signal $S_{acc\_raw}$ at 400 Hz) or to multiples of 2 (sampling the raw signal $S_{acc\_raw}$ at multiples of 400 Hz). Other values may be chosen as needed.

Returning to FIG. 4, a stationarity condition of the filtered signal $S_{acc\_filt}$ preceding the first peak p1 is detected in step 46. In particular, this step aims to detect whether the first peak detected is caused by an actual touch event or is caused by a more complex "shock" event, such as for example a shaking situation of the electronic system 1 that accommodates the accelerometer 4. In fact, in the case of shaking, there is a continuous perturbation of the signal of the accelerometer 4, which may also result in the generation of one or more peaks that exceed the preset thresholds ±Th, such as for example illustrated in FIG. 6.

Figure 5:
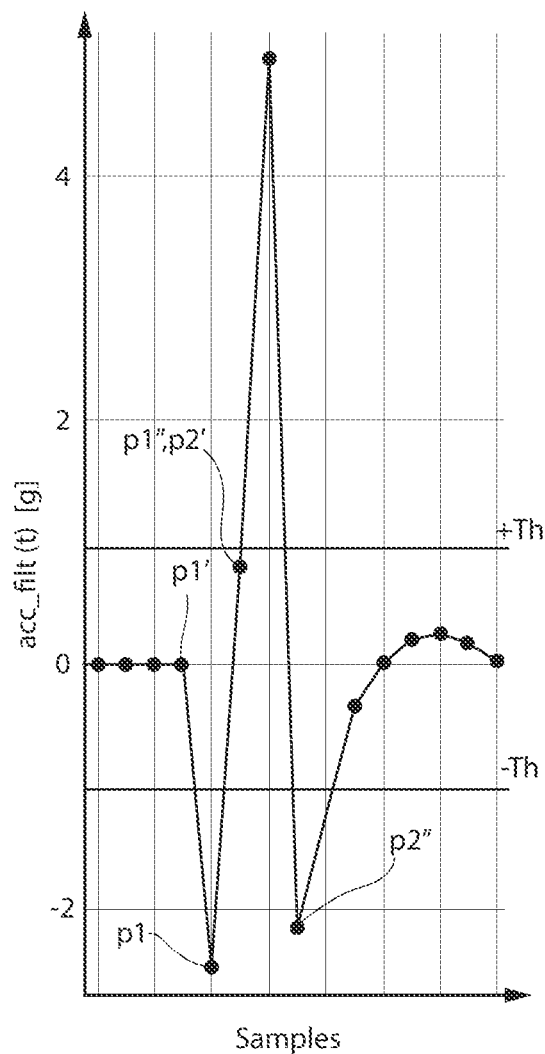
FIGS. 5-7 graphically illustrate respective steps of the method of FIG. 4.
Figure 6:
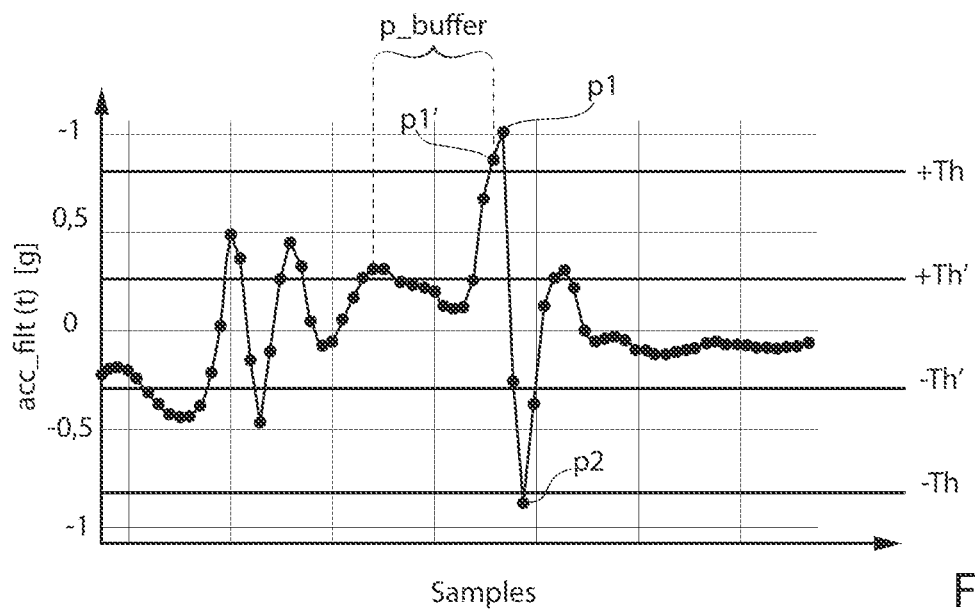
Figure 7:
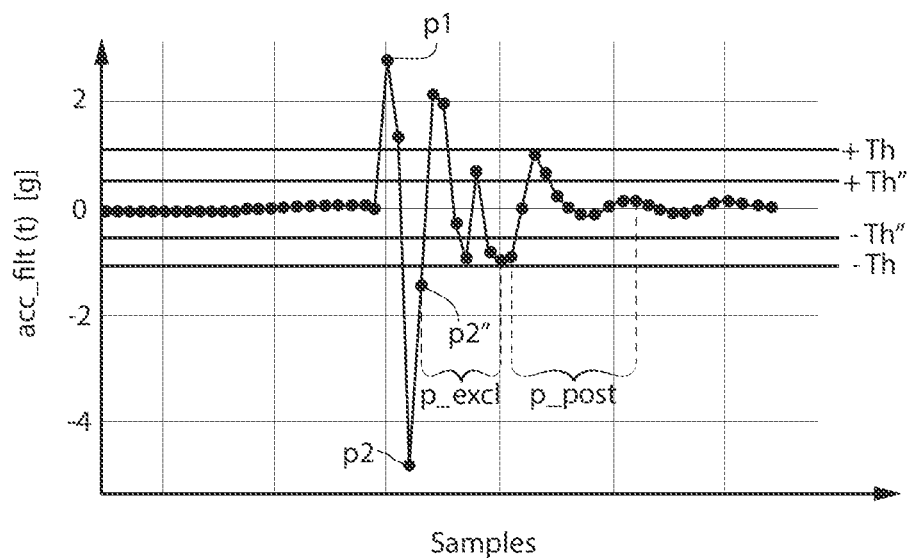

Step 46 is described herein with graphic reference to FIG. 6, for improved clarity. In FIG. 6 the same notation of FIG. 5 is used to identify the first peak (p1) and the inverted peak (p2) that exceed the preset thresholds ±Th. To discriminate between touch events and events of other type, such as for example shaking, according to an aspect of the present disclosure, a history buffer is used wherein a plurality of samples p_pre (temporally) preceding the first peak p1 are stored. In particular, this plurality of samples is a number equal to or greater than 8 (for example, 16 or 32), and includes the sample p1' and the other samples immediately preceding the sample p1'. When the first peak p1 is detected (according to what has been previously discussed), the history buffer is analyzed, according to step 46, to verify a stationarity condition of the samples stored therein. In particular, the stationarity condition is verified if all the samples stored in the history buffer, or a subset thereof, are comprised between a positive threshold +Th' and a negative threshold −Th' (with |+Th'|<|+Th| and |−Th'|<|−Th|). For example, the value in modulus of the thresholds ±Th' is comprised between 0.0625 g and 2 g.

In an embodiment, the stationarity condition is assessed on the samples present in the history buffer except for a subset of samples immediately preceding the first peak p1 (for example the 2 samples immediately preceding the first peak p1). The Applicant has in fact verified that the signal relating to the touch includes the samples immediately preceding the peak.

In step 48 the second peak p2 (inverted peak) is sought and, if any, detected, according to what has already been previously discussed.

In step 50 a stationarity condition of the filtered signal $S_{acc\_filt}$ following the second peak p2 is detected. In particular, this step aims to detect whether the second peak p2 detected is caused by an actual touch event or is caused by a more complex "shock" event, such as for example a clapping situation, which persists for a certain period of time, and which causes the generation of an accelerometric signal wherein a series of positive and negative above-threshold peaks (similar to the sequence of the first peak p1 and the second peak p2) are followed by a plurality of further peaks or a high noise signal, as for example illustrated in FIG. 7 (wherein the same notation of FIG. 5 is used to identify the first peak p1 and the inverted peak p2).

Therefore, in order to identify this situation, as said generated for example by clapping hands, according to an aspect of the present disclosure, a plurality of samples following the second peak p2 are analyzed.

In particular, this plurality of samples is a number equal to or greater than 8 (for example, 16 or 32), and includes the sample p2" and other samples immediately following the sample p2." In particular, the stationarity condition is verified if all the samples immediately following the second peak p2, or a subset thereof, are comprised between a positive threshold +Th" and a negative threshold −Th" (with |+Th"|<|+Th| and |−Th"|<|−Th|). For example, the value in modulus of the thresholds ±Th" is comprised between 0.0625 g and 2 g.

In an embodiment, the stationarity condition is assessed on a plurality of samples p_post following the second peak p2 except for a subset of samples p_excl immediately following the second peak p2 (e.g., excluding the 6-8 samples immediately following the second peak p2). In fact, the Applicant has verified that in some practical conditions, in the event of a signal resulting from a "touch" (therefore the event to be detected), after the second peak p2 a step is observed wherein the oscillation of the signal of the accelerometer 4 persists for a limited time, similarly to a "rebound" effect. In this manner, the stationarity condition is assessed by excluding this settling step following the second peak p2.

The method described with reference to FIG. 4 may be modified as needed. In particular, the first peak may indifferently be a negative or positive peak and, as a result, the second peak (inverted peak) is a positive or negative peak respectively. Furthermore, the stationarity verifications of steps 46 and 50 may be carried out both or one as an alternative to the other. For example, it is possible to provide for carrying out only the stationarity verification of step 46 and not the stationarity verification of step 50, or vice versa.

Furthermore, the method of FIG. 4 may also be used to identify a multiple touch event (e.g., double or triple touch), verifying the presence of a plurality of consecutive touch events in a predefined (and possibly configurable) period of time. To this end, it is possible to use a timer or counter usable to, after the occurrence of a touch event, count the number of samples that are present before the following touch event. If this number of samples is comprised in a predefined range (or lower than a maximum value) then the second touch event is correlated with the first touch event to validate the multiple touch event.

Figure 8:
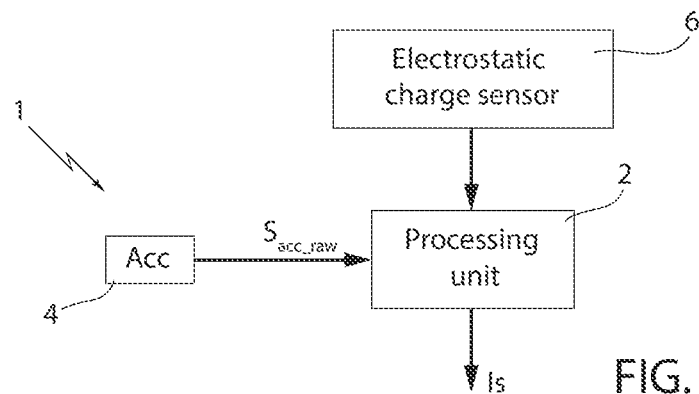
FIG. 8 illustrates the electronic or electromechanical system or chip or package of FIG. 3 further comprising an electrostatic charge sensor, according to a further aspect of the present disclosure.

In an embodiment of the present disclosure, illustrated in FIG. 8, the electronic system 1 comprises (e.g., integrates or accommodates in the case), in addition to the elements illustrated in FIG. 1 and previously described, also an electrostatic charge variation sensor 6 operatively coupled to the processing unit 2.

FIG. 9 illustrates, by way of non-limiting example, an embodiment of the electrostatic charge variation sensor 6. The electrostatic charge variation sensor 6 comprises an input electrode 8, coupeable to a body portion of a user. In particular, the electrostatic charge variation sensor 6 of FIG. 9 is configured to be placed in electrical or electrostatic contact with a body portion of a user, for detecting the touch. Typically, the user uses his/her finger, and in particular his/her fingertip, to perform the touch.

The input electrode 8 forms part of a differential input 9 of an instrumentation amplifier 12.

An input capacitor $C_I$, biased through a direct current (DC) generator $G_I$ and an input resistor $R_I$ connected in parallel with each other and with the input capacitor $C_I$ are at the ends of the differential input 9. In use, the voltage Vd across the input capacitor $C_I$ remains constant until the user touches the electrode 8; in this case, the voltage across the input capacitor $C_I$ varies due to the electric charge/discharge process through the user's body. In presence of a touch event and consequently after a transient (the duration thereof being defined by the constant RC of the parallel between capacitor $C_I$ and resistor $R_I$) the voltage Vd returns to its steady state value.

The instrumentation amplifier 12 is essentially formed by two operational amplifiers OP1 and OP2. A biasing stage (buffer) OP3 is used to bias the instrumentation amplifier 12 to a common mode voltage $V_{CM}$.

The inverting terminals of the operational amplifiers OP1 and OP2 are connected to each other through a resistor $R_2$. Since the two inputs of each operational amplifier OP1, OP2 are to be at the same potential, the input voltage Vd is also applied across $R_2$ and causes, through this resistor $R_2$, a current equal to $I_2=Vd/R_2$. This current $I_2$ does not come from the input terminals of the operational amplifiers OP1, OP2 and therefore flows through the two resistors $R_1$ connected between the outputs of the operational amplifiers OP1, OP2, in series with the resistor $R_2$; the current $I_2$, thus flowing through the series of the three resistors $R_1$-$R_2$-$R_1$, produces an output voltage Vd' given by Vd'=$I_2 \cdot (2R_1+R_2)$ =Vd·(1+2$R_1/R_2$). Therefore, the overall gain of the circuit of FIG. 9 is Ad=(1+2$R_1/R_2$). The differential gain depends on the value of the resistor $R_2$ and may therefore be modified by acting on the resistor $R_2$.

The components of the amplifier 12 are chosen in such a way that the amplifier 12 has high impedance (of the order of $10^9$ Ohm) in its passband (chosen between DC and 500 Hz).

The voltage Vd across the input capacitor $C_I$ is detected by the amplifier 12.

The differential output Vd' is therefore proportional to the potential Vd at input, and is provided at input to an analog-to-digital converter 14, which provides the charge variation signal $S_Q$ for the processing unit 2 at output. The charge variation signal $S_Q$ is, for example, a high-resolution digital stream (16 bits or 24 bits).

According to an embodiment, the analog-to-digital converter 14 is optional, since the processing unit 2 may be configured to work directly on the analog signal, or may itself comprise an analog-to-digital converter for converting the signal Vd'.

According to an embodiment, having an analog-to-digital converter (ADC) with suitable characteristics (e.g., differential input, high input impedance, high resolution, dynamic range optimized for the quantities to be measured, low noise) the amplifier stage 12 may be omitted, by feeding the signal directly to the input of the analog-to-digital converter.

FIG. 10 illustrates, through a flow chart, the operations carried out by the processing unit 2 to process the signal provided by the electrostatic charge variation sensor 6.

Figure 11:
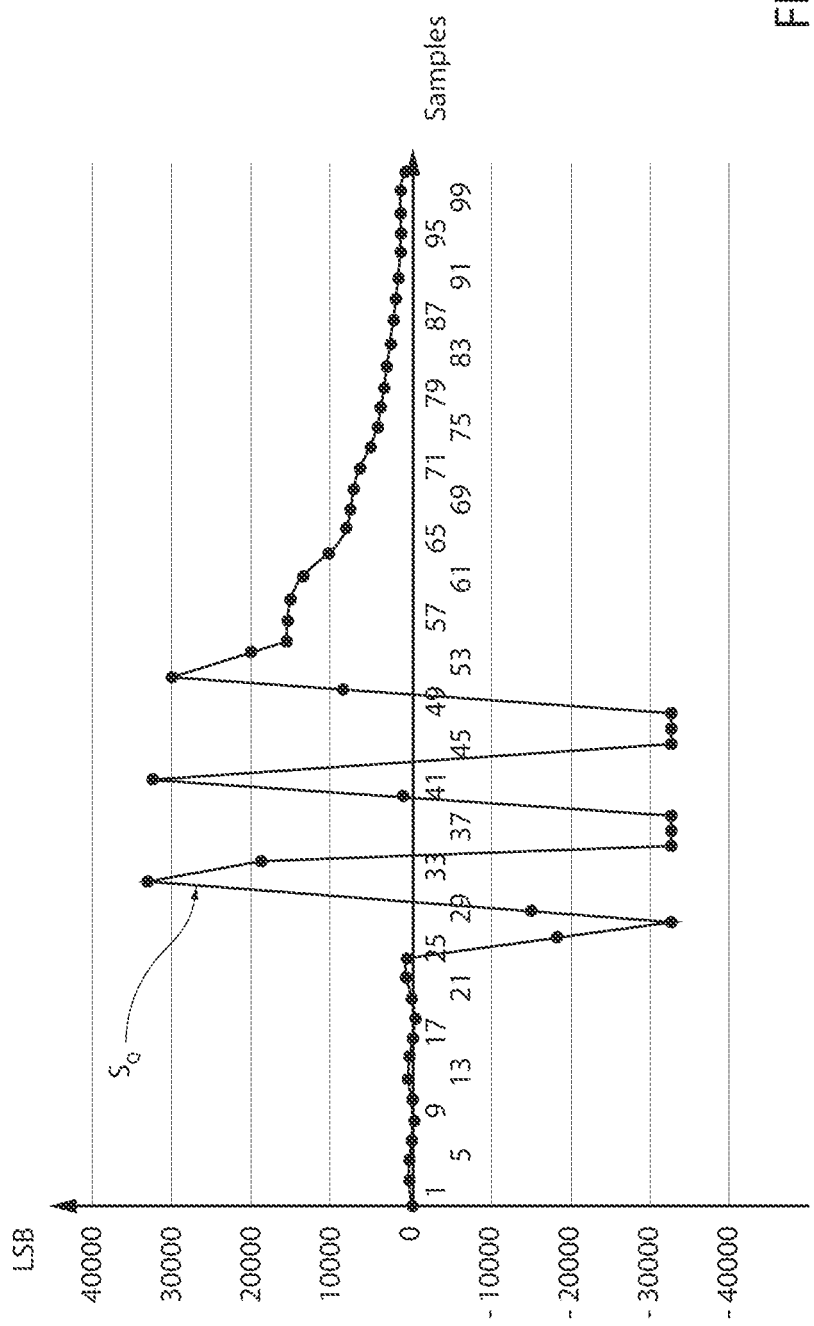
FIGS. 11 and 12 graphically illustrate respective steps of the method of FIG. 10.

With reference to step 60, the processing unit 2 receives, from the electrostatic charge variation sensor 6, the charge variation signal $S_Q$. The signal $S_Q$ is, in the described embodiment, a digital signal. FIG. 11 exemplarily illustrates the signal $S_Q$ generated following an event of contact between the input electrode 8 and the fingertip of a user (touch event). The values of the potential Vd, induced by the physical contact of the user with the input electrode 8, are represented on the ordinate axis of the charge variation signal $S_Q$. This value is here expressed in LSB ("Least Significant Bit"), that is the minimum digital value output from the analog-to-digital converter, which is proportional to the voltage detected at the input electrode 8. Typically 1 LSB corresponds to a value comprised between a few μV and a few tens of μV. The constant of proportionality (or sensitivity) depends on the gain of the amplifier, on the resolution of the analog-to-digital converter and on any digital processing (e.g., oversampling, decimation, etc.). The LSB representation is common in the art and disregards a quantification in physical units, as the aim is typically to detect relative variations, with respect to a steady or base state. The progressive numbers of the acquired sample are represented on the abscissa axis of the charge variation signal $S_Q$.

Then, step 62, the processing unit 2 performs an operation of calculating or estimating the variance of the signal $S_Q$, obtaining the variance signal $S_{Q\_var}$. The calculation or estimation of the variance is carried out in a per se known manner, for example as described by Tony Finch in "Incremental calculation of weighted mean and variance," University of Cambridge Computing Service, February 2009. Other methods may be used, such as for example, approaches based on IIR filters, or yet others.

Figure 12:
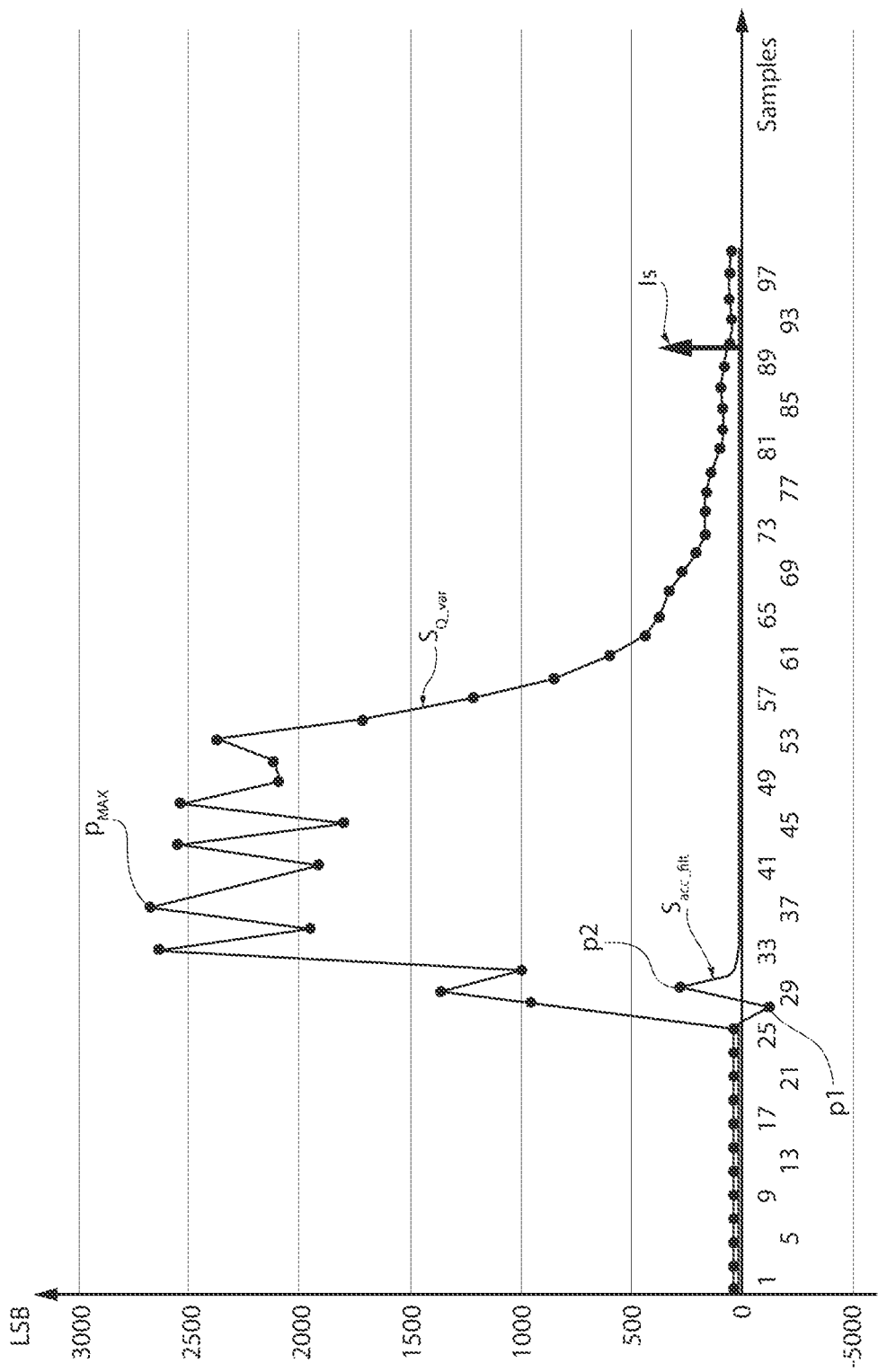

FIG. 12 illustrates the variance signal $S_{Q\_var}$, and the filtered accelerometer signal $S_{acc\_filt}$, superimposed to each other. It is noted that FIG. 12 shows the square root of the signals $S_{acc\_filt}$ and $S_{Q\_var}$. The operation of calculating the square root of the variance value has the function of compressing the dynamics of the output signal, as well as of bringing it back to the initial physical dimension. In other words, the variance squares, the square root restores the physical dimensions. For example, if the physical dimension x of the input signal is $[x]^2$; after the variance it is $[(x^2)]^2$; after the square root operation it returns to $[x]^2$.

Then, step 64, a step of searching for a maximum point of the signal $S_Q$ is carried out. The maximum point corresponds, in this example wherein digital signals (samples) are used, to the sample whose value (on the ordinate axis) is the greatest with respect to a plurality of comparison samples. In particular, each sample is compared with the maximum value detected up to that instant and, if it is greater than the maximum value, the maximum value is updated to the value of the current sample. This operation is initiated (e.g., the maximum is reset to the current value) after the detection of a "shock" event by the accelerometer 4. The shock event considered is any event that causes the generation of a signal of the accelerometer 4 which, after having been filtered as previously described (e.g., high-pass filter or Slope filter), exceeds the threshold +Th (positive exceedance) or —Th (negative exceedance). The exceedance of the threshold ±Th is confirmed if at least one sample of the signal $S_{acc\_filt}$ exceeds the threshold ±Th.

In FIG. 12, it is the sample #28 of the signal $S_{acc\_filt}$ that negatively exceeds the threshold −Th (first peak p1). This event triggers the search for the maximum of the signal $S_{Q\_var}$. At sample #28, the maximum value is reset to the current value of the signal $S_{Q\_var}$. Therefore, from the corresponding sample #28 (or from the subsequent, the sample #29) of the signal $S_{Q\_var}$, it is assessed whether this sample has a value (here, in LSB) which is greater than the maximum value calculated up to that instant. This operation continues until the detection of an actual touch signal, as described hereinafter in the following step 66. The maximum value assumed by the $S_{Q\_var}$ is saved in memory. In the example of FIG. 12, the sample having the maximum value was found at the sample #36 of the signal $S_{Q\_var}$ (sample $p_{MAX}$).

Then, step 66, the confirmation of the occurred touch is awaited on the basis of the signal of the accelerometer 4 (e.g., the interrupt signal Is previously mentioned). In FIG. 12, this signal is generated at sample #90. The search for the maximum value of the signal $S_{Q\_var}$ discussed in step 64 is thus interrupted.

In this embodiment, the final decision of the occurred touch is taken, as well as a function of the signal of the accelerometer 4, also as a function of the signal acquired by the electrostatic charge variation sensor 6 and processed as previously discussed. In particular, upon receiving the interrupt signal Is, a current sample of the signal $S_{Q\_var}$ is acquired (for the purposes of the present disclosure, this current sample is exemplarily the one at which the interrupt was received). The value of the current sample is compared to a threshold Th_Q.

In an embodiment, if the value of the sample $p_{max}$ of the signal $S_{Q\_var}$ is in a predefined relationship with this threshold (in particular, it exceeds the threshold Th_Q) the touch event is confirmed and one or more functionalities correlated to this touch event (not object of the present disclosure) are activated. The threshold Th_Q is preset to a value chosen during the design step and in any case changeable (e.g., comprised between 8000 and 12000 LSB); this value is chosen on the basis of the sensor and electrode used, through laboratory tests.

In a further embodiment, if the value of the sample $p_{MAX}$ of the signal $S_{Q\_var}$ is in said predefined relationship with this threshold (in particular, it exceeds the threshold Th_Q), then a further comparison of the value of the current sample of the signal $S_{Q\_var}$ with a second threshold Th_Q' chosen as a fraction of the maximum value of the previously identified signal $S_{Q\_var}$ (i.e., in this example, that found at the sample #36) is carried out. For example, the second threshold Th_Q' is equal to ¼ of the maximum value of the signal $S_{Q\_var}$. In this embodiment, the aforementioned operations are carried out on the variance signal under square root (as previously said). Other embodiments are however possible. If both comparisons with the thresholds Th_Q and Th_Q' comply with a respective predefined condition (in particular, the value of the sample $p_{MAX}$ of the signal $S_{Q\_var}$ exceeds the threshold Th_Q and the current value of the signal $S_{Q\_var}$ is lower than the threshold Th_Q'), then the touch event is confirmed and one or more functionalities correlated to this touch event (not object of the present disclosure) are activated.

In a further embodiment, additional or alternative to those previously described, the use of the signal resulting from the electrostatic charge sensor 6 may also be used to detect a touch condition that persists over time, for example when the user performs the touch while holding the pressure for a continuous time of a few tenths of a second (e.g., 0.6 seconds). This event, herein identified as a "long touch," may be used to activate further or different functionalities with respect to those that may be activated with a traditional, typically rapid, touch event.

Figure 13:
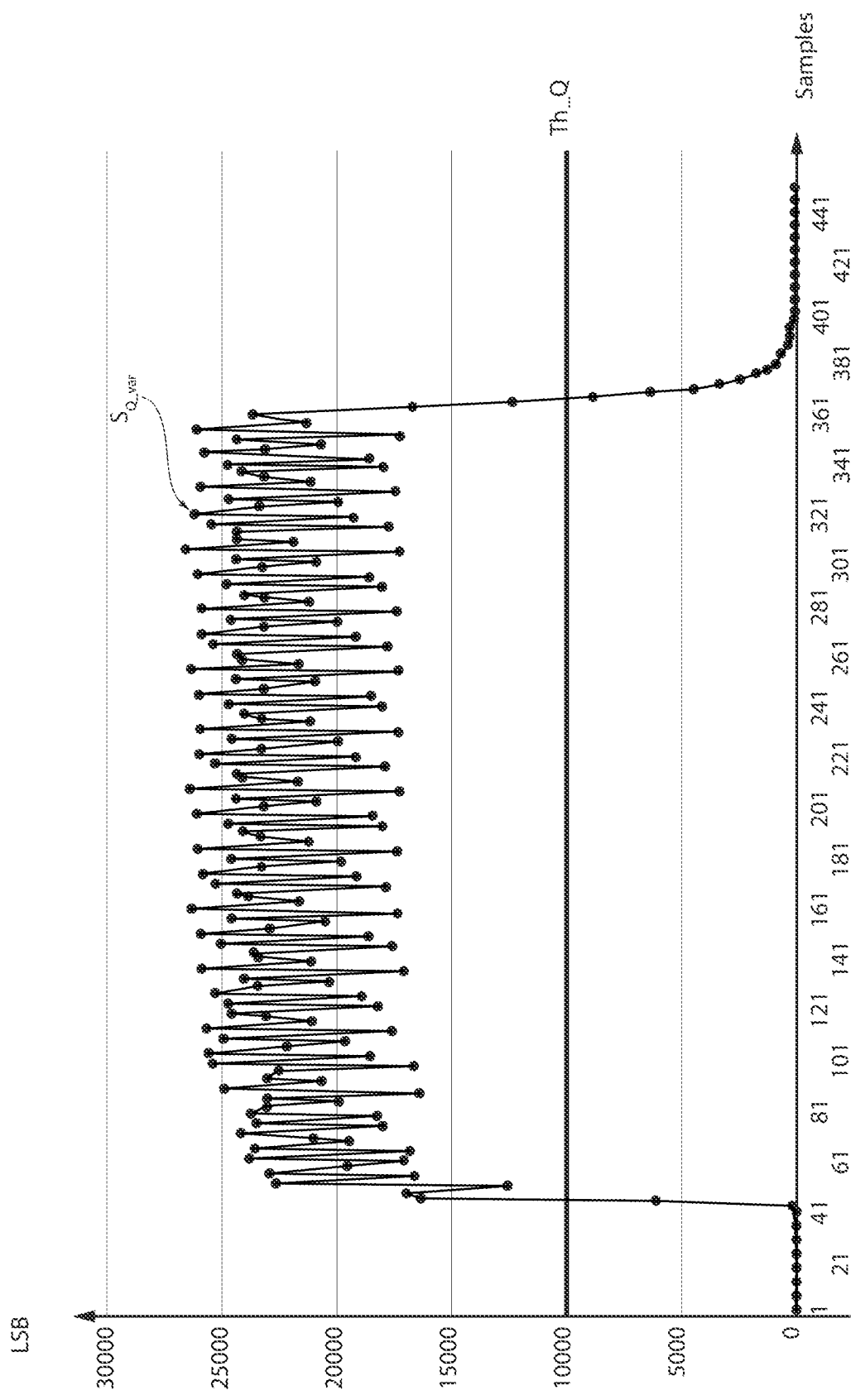
FIG. 13 graphically illustrates an electrostatic charge variation signal generated by a touch prolonged over time of a detection electrode of the electrostatic charge sensor of FIG. 9.

The long touch event is identified if the signal $S_{Q\_var}$ remains above the threshold Th_Q for a time which is longer than a minimum time, predefined during the design step and in any case configurable as needed. It is apparent that the comparison threshold for the long touch may be a further threshold different from the thresholds Th_Q, for example chosen equal to 10000 LSB. FIG. 13 illustrates an example of signal $S_{Q\_var}$ that identifies a long touch.

Furthermore, the method of FIG. 10 may also be used to identify a multiple-touch event (e.g., double or triple touch), verifying the presence of a plurality of consecutive touch events in a predefined (and possibly configurable) period of time, similarly to what has been described hereinabove with reference to the method of FIG. 4.

FIG. 14 schematically illustrates an electronic device 100 which includes the previously described electronic system 1, according to any of the embodiments of the present disclosure.

For example, the electronic device 100 comprises a touch-sensitive surface 102 (detection surface), which is the surface at which the user performs the physical touch gesture. This surface is, for example, of plastic material, with a thickness of approximately 1 mm. The electronic system 1 is placed below the surface 102, for example accommodated in an own package.

In order to optimize the generation of both signals $S_Q$ and $S_{acc}$, it is preferable, but not necessary, that the relative arrangement between the surface 102 and the electronic system 1 meets one or more of the following parameters:
  the sensors for detecting the acceleration and the charge variation are arranged as proximate as possible to the area identified as the touch surface; and
  the sensors for detecting the acceleration and the charge variation are placed proximate to each other, to optimize the correlation of the respective signals.

The disclosure may be effectively implemented in all those devices wherein a mechanical contact cannot be present, or for impermeability, immunity to dust or mechanical strength requirements. Some examples: smartphones, smartwatches, True Wireless Stereos (TWS), headsets, appliances, industrial equipment, etc.

The advantages achieved by the present disclosure are apparent from the previous description.

In particular, the use of an accelerometer and, in the respective embodiment, of an electrostatic charge sensor allow the consumptions to be significantly reduced with respect to solutions that provide a sensor with a panel of "touch-screen" type.

Furthermore, the solution described with reference to FIG. 4 (detection of the stationarity before and/or after the detection of the first and second peaks) allows false positives to be significantly reduced. The solution that provides the use of the electrostatic charge sensor further improves the performances of rejections of false positives with respect to the solution with accelerometer only.

Furthermore, the use of the electrostatic charge sensor expands the range of gestures that the user may use to give commands to the system 100 (e.g., the long touch).

Variations and modifications may be applied to the present disclosure, without departing from the scope identified by the claims.

For example, respective operations of filtering (for example using low-pass or high-pass filters) the signals $S_{acc}$ and $S_Q$ may be provided. In particular, the filtering has the function of removing noise or non-significant frequency disturbing components, or low frequency components (e.g., gravity acceleration component or movements attributable to human activity for $S_{acc}$), from the signals $S_{acc}$ and $S_Q$.

Furthermore, the processing of the signals of the accelerometer 4 and of the electrostatic charge sensor 6 may be implemented entirely in hardware, entirely in software or in mixed hardware/software form, as needed.

A system (1) for detecting a touch gesture of a user on a detection surface (102), the system may be summarized as including a processing unit (2); an accelerometer (4), operatively coupled to the processing unit (2), configured to detect a vibration at said detection surface (102) and generate a corresponding vibration signal ($S_{acc\_raw}$), wherein the processing unit (2) is configured to acquire the vibration signal ($S_{acc\_raw}$), detect, in the vibration signal ($S_{acc\_raw}$, $S_{acc\_filt}$), a signal characteristic (p1, p2) which can be correlated to said touch gesture of the user, detect, in the vibration signal ($S_{acc\_raw}$, $S_{acc\_filt}$), a stationarity condition preceding and/or following said detected signal characteristic, and validate said touch gesture by the user in the event that both the signal characteristic and the stationary condition preceding and/or following said signal characteristic have been detected.

The operation of detecting said signal characteristic (p1, p2) may include calculating a filtered vibration signal ($S_{acc\_filt}$) by filtering, through a high-pass filter, the vibration signal ($S_{acc\_raw}$); detecting a first peak (p1) of the filtered vibration signal ($S_{acc\_filt}$) exceeding a first threshold (−Th; +Th); and detecting a second peak (p2) of the filtered vibration signal ($S_{acc\_filt}$) exceeding a second threshold (+Th; −Th), wherein the first threshold may be one of a positive threshold and a negative threshold, and the second threshold may be the other of said positive threshold and said negative threshold.

The processing unit (2) may be further configured to sample the vibration signal ($S_{acc\_raw}$), and the operation of calculating the filtered vibration signal ($S_{acc\_filt}$) may be carried out using a digital filter, said operation of detecting the first peak may include detecting a first sample (p1) of the filtered vibration signal ($S_{acc\_filt}$) which exceeds the first threshold; detecting a second sample (p1') of the filtered vibration signal ($S_{acc\_filt}$) immediately preceding the first sample (p1) and having a value, in modulus, which may be lower than the value, in modulus, of the first sample (p1); and detecting a third sample (p1") of the filtered vibration signal ($S_{acc\_filt}$) immediately following the first sample (p1) and having a value, in modulus, which may be lower than the value, in modulus, of the first sample (p1), said first peak corresponding to the first sample (p1).

Said operation of detecting the second peak (p2) may include detecting a fourth sample (p2) of the filtered vibration signal ($S_{acc\_filt}$) which exceeds the second threshold; detecting a fifth sample (p2') of the filtered vibration signal ($S_{acc\_filt}$) immediately preceding the fourth sample (p2) and having a value, in modulus, which may be lower than the value, in modulus, of the fourth sample (p2); and detecting a sixth sample (p2") of the filtered vibration signal ($S_{acc\_filt}$) immediately following the fourth sample (p2) and having a value, in modulus, which may be lower than the value, in modulus, of the fourth sample (p2), said second peak corresponding to the fourth sample (p2).

The operation of detecting said signal characteristic (p1, p2) may further include verifying that the first peak (p1) and the second peak (p2) may be at a mutual distance, in terms of number of samples included between the first peak (p1) and the second peak (p2), which may be lower than a maximum value of number of samples.

The operation of detecting, in the vibration signal ($S_{acc\_raw}$, $S_{acc\_filt}$), a stationarity condition preceding said signal characteristic (p1, p2) may include after detecting the first peak (p1), verifying that the values of a first plurality of samples (p_pre) of the filtered vibration signal ($S_{acc\_filt}$) preceding the first peak (p1) may be included in a first range of reference values (±Th').

The operation of detecting, in the vibration signal ($S_{acc\_raw}$, $S_{acc\_filt}$), a stationarity condition following said signal characteristic (p1, p2) may include after detecting the second peak (p2), verifying that the values of a second plurality of samples (p_post) of the filtered vibration signal ($S_{acc\_filt}$) following the second peak (p2) may be included in a second range of reference values (±Th").

The operation of detecting, in the vibration signal ($S_{acc\_raw}$, $S_{acc\_filt}$), a stationarity condition following said signal characteristic (p1, p2) may further include discarding a third plurality of samples (p_excl) of the filtered vibration signal ($S_{acc\_filt}$) immediately following the second peak (p2) and may be included between the second peak (p2) and said second plurality of samples of the filtered vibration signal ($S_{acc\_filt}$).

The system may further include an electrostatic charge variation sensor (6), operatively coupled to the processing unit (2), configured to detect an electrostatic charge variation at said detection surface and, as a result, generate a charge variation signal ($S_Q$).

The processing unit (2) may be further configured to generate a variance signal ($S_{Q\_var}$) by calculating the variance of the charge variation signal ($S_Q$).

The processing unit (2) may be further configured to detect a maximum point ($p_{MAX}$) of the variance signal ($S_{Q\_var}$) when said signal characteristic which can be correlated to said touch gesture of the user may be detected in the vibration signal ($S_{acc\_raw}$, $S_{acc\_filt}$).

The processing unit (2) may be further configured to verify whether the maximum point ($p_{MAX}$) of the variance signal ($S_{Q\_var}$) may be in a predefined relationship with a third threshold, and in the event that both the signal characteristic and the stationarity condition preceding and/or following said signal characteristic have been detected, validate said touch gesture only if the maximum point ($p_{MAX}$) of the variance signal ($S_{Q\_var}$) meets said predefined relationship with the third threshold.

The processing unit (2) may be further configured to in the event that both the signal characteristic and the stationarity condition preceding and/or following said signal characteristic have been detected, and if the maximum point ($p_{MAX}$) of the variance signal ($S_{Q\_var}$) meets said predefined relationship with the third threshold, verify whether the variance signal ($S_{Q\_var}$) may be in a stationarity condition and validate said touch gesture only if the variance signal ($S_{Q\_var}$) meets said stationarity condition.

The stationarity condition of the variance signal ($S_{Q\_var}$) may be met if at least one current sample of the variance signal ($S_{Q\_var}$) has a value included within a range of stationarity reference values.

The system may further include the step of detecting a touch event that persists over time if the variance signal ($S_{Q\_var}$) remains above a fourth threshold for a time which may be longer than a predefined touch time.

An electronic device (100) may be summarized as including a detection surface (102) of a touch gesture by a user; and a system (1) for detecting a touch gesture according to any of claims 1-15.

A method for detecting a touch gesture of a user on a detection surface (102), using a system (1) that may be summarized as including a processing unit (2); and an accelerometer (4), operatively coupled to the processing unit (2), configured to detect a vibration at said detection surface (102) and generate a corresponding vibration signal ($S_{acc\_raw}$), the method including the steps, carried out by the processing unit (2), of acquiring the vibration signal ($S_{acc\_raw}$), detecting, in the vibration signal ($S_{acc\_raw}$, $S_{acc\_filt}$), a signal characteristic (p1, p2) which can be correlated to said touch gesture of the user, detecting, in the vibration signal ($S_{acc\_raw}$, $S_{acc\_filt}$), a stationarity condition preceding and/or following said detected signal characteristic, and validate said touch gesture by the user in the event that both the signal characteristic and the stationary condition preceding and/or following said signal characteristic have been detected.

Said system (1) may further include an electrostatic charge variation sensor (6), operatively coupled to the processing unit (2), the method may further include the steps of detecting, through the electrostatic charge variation sensor (6), an electrostatic charge variation at said detection surface and generating as a result, through the electrostatic charge variation sensor (6), a charge variation signal ($S_Q$).

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system for detecting a touch gesture on a detection surface, the system comprising:
   an accelerometer, configured to detect a vibration at said detection surface and generate a vibration signal corresponding to the vibration; and
   a processing unit, operatively coupled to the accelerometer, and configured to:
   acquire the vibration signal,
   detect, in the vibration signal, a signal characteristic correlated to said touch gesture,
   detect, in the vibration signal, a stationarity condition adjacent to said detected signal characteristic in a time sequence, and
   validate said touch gesture in response to that both the signal characteristic and the stationary condition have been detected.

2. The system according to claim 1, wherein detecting said signal characteristic comprises:
   calculating a filtered vibration signal by filtering, through a high-pass filter, the vibration signal;
   detecting a first peak of the filtered vibration signal exceeding a first threshold; and detecting a second peak of the filtered vibration signal exceeding a second threshold, wherein the first threshold is one of a positive threshold or a negative threshold, and the second threshold is another one of said positive threshold or said negative threshold.

3. The system according to claim 2, wherein the processing unit is further configured to sample the vibration signal, and calculating the filtered vibration signal is carried out using a digital filter, wherein detecting the first peak includes:
detecting a first sample of the filtered vibration signal which exceeds the first threshold;
detecting a second sample of the filtered vibration signal immediately preceding the first sample and having a value in modulus lower than the value in modulus of the first sample; and
detecting a third sample of the filtered vibration signal immediately following the first sample and having a value in modulus lower than the value in modulus of the first sample,
wherein said first peak corresponds to the first sample.

4. The system according to claim 3, wherein detecting the second peak comprises:
detecting a fourth sample of the filtered vibration signal which exceeds the second threshold;
detecting a fifth sample of the filtered vibration signal immediately preceding the fourth sample and having a value in modulus lower than the value in modulus of the fourth sample; and
detecting a sixth sample of the filtered vibration signal immediately following the fourth sample and having a value in modulus lower than the value in modulus of the fourth sample,
wherein said second peak corresponds to the fourth sample.

5. The system according to claim 2, wherein detecting said signal characteristic comprises verifying that the first peak and the second peak are at a mutual distance, in terms of number of samples between the first peak and the second peak, which is lower than a maximum value of number of samples.

6. The system according to claim 2, wherein detecting, in the vibration signal, a stationarity condition adjacent to said signal characteristic comprises:
after detecting the first peak, verifying that values of a first plurality of samples of the filtered vibration signal preceding the first peak are in a first range of reference values.

7. The system according to claim 2, wherein the operation of detecting, in the vibration signal, a stationarity condition adjacent to said signal characteristic comprises:
after detecting the second peak, verifying that values of a second plurality of samples of the filtered vibration signal following the second peak are in a second range of reference values.

8. The system according to claim 7, wherein detecting, in the vibration signal, the stationarity condition adjacent to said signal characteristic further comprises discarding a third plurality of samples of the filtered vibration signal immediately following the second peak and between the second peak and said second plurality of samples of the filtered vibration signal.

9. The system according to claim 1, further comprising an electrostatic charge variation sensor, operatively coupled to the processing unit, configured to detect an electrostatic charge variation at said detection surface and, as generate a charge variation signal based on the electrostatic charge variation.

10. The system according to claim 9, wherein the processing unit is further configured to calculate a variance value based on the charge variation signal.

11. The system according to claim 10, wherein the processing unit is further configured to detect a maximum point of the variance value in response to said signal characteristic correlated to said touch gesture of a user is detected in the vibration signal.

12. The system according to claim 11, wherein the processing unit is further configured to:
verify whether the maximum point of a variance signal meets a relationship with a third threshold, and
in response to that both the signal characteristic and the stationarity condition adjacent to said signal characteristic have been detected, validate said touch gesture only if the maximum point of the variance signal meets said relationship with the third threshold.

13. The system according to claim 11, wherein the processing unit is further configured to:
in the event that both the signal characteristic and the stationarity condition preceding and/or following said signal characteristic have been detected, and if the maximum point of the variance signal meets said predefined relationship with a third threshold, verify whether the variance signal is in a stationarity condition and validate said touch gesture only if the variance signal meets said stationarity condition.

14. The system according to claim 13, wherein the stationarity condition of the variance signal is met in response to at least one current sample of the variance signal has a value within a range of stationarity reference values.

15. The system according to claim 10, further comprising detecting a touch event that persists over time in response to the variance signal remains above a fourth threshold for a time which is longer than a predefined touch time.

16. The system according to claim 1, comprising:
the detection surface configured to receive the touch gesture of a user.

17. A method for detecting a touch gesture of a user on a detection surface, the method comprising:
detecting, by an accelerometer, a vibration at said detection surface;
generating, by the accelerometer, a vibration signal corresponding to detecting the vibration;
acquiring, by a processing unit communicatively coupled to the accelerometer, the vibration signal;
detecting, by the processing unit in the vibration signal, a signal characteristic correlated to said touch gesture of the user;
detecting, by the processing unit in the vibration signal, a stationarity condition adjacent to said detected signal characteristic in a time sequence; and
validate, by the processing unit, said touch gesture in response to that both the signal characteristic and the stationary condition have been detected.

18. The method according to claim 17, further comprising:
detecting, by an electrostatic charge variation sensor operatively coupled to the processing unit, an electrostatic charge variation at said detection surface; and
generating as a result of detecting the electrostatic charge variation, by the electrostatic charge variation sensor, a charge variation signal.

19. A system, the system comprising:
   an accelerometer, configured to detect a vibration at a detection surface and generate a vibration signal based on the vibration;
   an electrostatic charge variation sensor, configured to detect an electrostatic charge variation at the detection surface and generate a charge variation signal based on the electrostatic charge variation; and
   a processing unit, communicatively coupled to the accelerometer and the electrostatic charge variation sensor, and configured to:
      acquire the vibration signal,
      detect, in the vibration signal, a signal characteristic correlated to a touch gesture,
      detect, in the vibration signal, a stationarity condition adjacent to said detected signal characteristic in a time sequence,
      calculating a variance value based on the charge variation signal, and
      validate said touch gesture in response to that both the signal characteristic and the stationary condition have been detected and based on the variance value.

20. The system of claim 19, wherein validating said touch gesture based on the variance value includes verifying whether a maximum point of the variance value meets a threshold.

\* \* \* \* \*